United States Patent [19]

Mawby et al.

[11] Patent Number: 5,484,306
[45] Date of Patent: Jan. 16, 1996

[54] QUICK-CONNECT TERMINAL AND RECEPTACLE

[75] Inventors: Terry P. Mawby, Paola; Ronny N. Galloway, Louisburg, both of Kans.

[73] Assignee: Interconnect Devices Inc., Kansas City, Kans.

[21] Appl. No.: 326,521

[22] Filed: Oct. 20, 1994

[51] Int. Cl.⁶ .................................................. H01R 4/24
[52] U.S. Cl. ........................... 439/441; 439/482; 439/843
[58] Field of Search ..................................... 439/439–441, 439/843, 482, 877

[56] References Cited

U.S. PATENT DOCUMENTS

| | | | |
|---|---|---|---|
| 3,187,296 | 6/1965 | Brackett . | |
| 3,315,163 | 4/1967 | Lutz . | |
| 3,602,872 | 8/1971 | Braunstein | 439/425 |
| 3,744,010 | 7/1973 | Meacham | 439/301 |
| 3,753,103 | 8/1973 | Tetreault et al. | 439/482 |
| 3,893,027 | 7/1975 | Veenendaal | 324/754 |
| 3,942,860 | 3/1976 | McDonough | 439/708 |
| 4,050,762 | 9/1977 | Hines et al. | 439/824 |
| 4,105,276 | 8/1978 | Miller | 439/441 |
| 4,133,594 | 1/1979 | Laverick et al. | 439/439 |
| 4,200,351 | 4/1980 | Long et al. | 439/824 |
| 4,461,530 | 7/1984 | Bush, Sr. et al. | 439/843 |
| 4,461,993 | 7/1984 | Glau | 439/482 |
| 4,597,622 | 7/1986 | Coe | 439/421 |
| 4,659,987 | 4/1987 | Coe et al. | 324/754 |
| 4,673,233 | 6/1987 | Hertelendy | 459/440 |
| 4,713,019 | 12/1987 | Gaynor | 439/441 |
| 4,720,275 | 1/1988 | Swart et al. | 439/725 |
| 4,885,533 | 12/1989 | Coe | 439/482 |
| 4,978,315 | 12/1990 | Edgley et al. | 439/441 |
| 4,983,909 | 1/1991 | Swart et al. | 439/482 |
| 5,032,787 | 7/1991 | Johnston et al. | 439/482 |
| 5,083,936 | 1/1992 | Yang | 439/441 |

Primary Examiner—David L. Pirlot
Assistant Examiner—Jill Demello
Attorney, Agent, or Firm—Stinson, Mag & Fizzell

[57] ABSTRACT

A quick-connect terminal and receptacle for electrical spring test probes used in the printed circuit testing industry has a tubular receptacle having an inner bore with an entrance for inserting a wire terminal. The terminal has an open end receiving a base end of a wire. A barb cut from the terminal wall extends angularly into the terminal bore and away from the open end. The barb has an edge for gripping the wire end and preventing easy pullout. The wire extends to circuit testers which execute a testing routine upon the printed circuit board. The receptacles contain removable and replaceable spring probes and the quick-connect terminal and receptacle assembly provides speed and ease of probe replacement. Sealing rings can extend between the terminal and receptacle to maintain vacuum for use of the arrangement in vacuum actuated test fixtures.

3 Claims, 2 Drawing Sheets

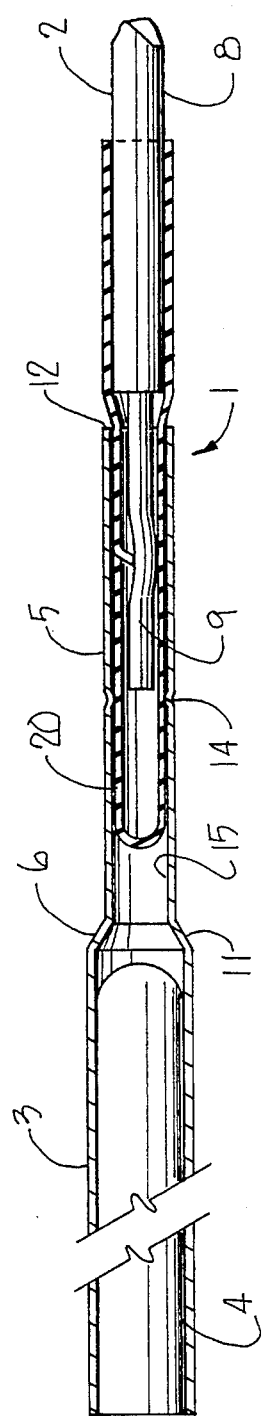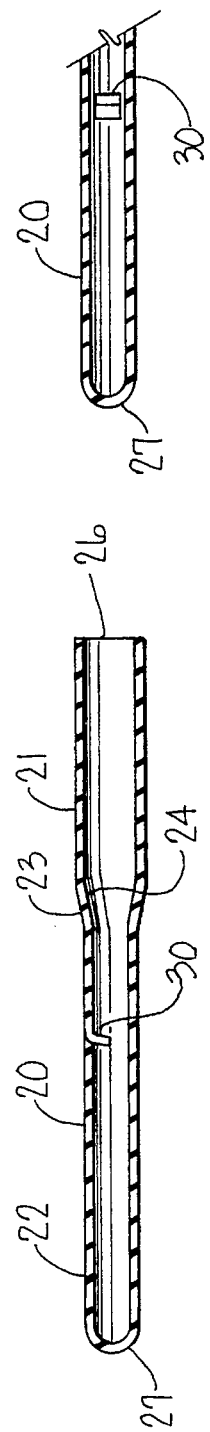

QUICK-CONNECT TERMINAL AND RECEPTACLE

FIELD OF THE INVENTION

This invention relates to wire terminals and particularly to such terminals that are quick-connectors for use with electrical spring contact probes in testing apparatus.

BACKGROUND OF THE INVENTION

Electrical spring contact probes are inserted into receptacles which are in turn inserted into a test fixture and connected by individual wires to a test logic device. The test fixture is then typically brought into engagement with a printed circuit board through a vacuum mechanism. Once in contact, computer generated test routines are routed through the wires and the probes to the printed circuit board to determine continuity and identify failure of the board circuit traces. With miniaturization of electronic circuits, the circuit tracings in the printed circuit board have become closer, and with the miniaturization of integrated circuit chips, chip footpads have become even more densely packed. This densely packed array of footpads and test sites for the electrical spring contact probes is commonly as low as 0.050 inches center to center.

The receptacles into which the spring probes are placed are each connected to an insulated, flexible wire. Normally, the wires are crimped or soldered to the receptacles; however, several techniques for using replaceable or reusable terminations have existed. Two such arrangements are shown in connection with U.S. Pat. Nos. 4,720,275 to Everett/Charles Contact Products, Inc. and 4,597,622 to QA Technology Company. Both of these companies are competitors to the assignee, and these two patents disclose termination arrangements which were heretofore the state of the art. Wire terminations on close centers, such as 0.050 inch centers, present a major challenge to the automated test equipment (ATE) industry. In addition to the terminations shown in the '275 and '622 patents, some wire to probe connections have been made by wire-wrapping, but wrapping on such fine pitch (e.g., closely-spaced) probes is difficult and normally requires special fixtures. Other methods, such as crimping and soldering, are too slow to be cost efficient with the volume of terminals which must be connected. The ATE industry has recently been using preattached wires as an alternative, but this method has disadvantages as well. Replacing or reassigning wires normally requires removal of the receptacle, and prewiring the receptacle to the fixture interface is difficult, if not impossible.

SUMMARY OF THE INVENTION

This invention is a special terminal and receptacle in which the bare end of a wire is quickly but securely attached to the terminal and the terminal inserted within the tail end of a probe receptacle mounted in the fixture. The terminal is tubular with an open end and has an internal barb which engages and retains a wire inserted into the terminal. The terminal has an internal shoulder which abuts the wire insulation to limit the extent of insertion. In another embodiment, the tail end of the receptacle is configured substantially the same as the separate terminal of the preferred embodiment is configured and the wire end is inserted directly into the receptacle tail.

DESCRIPTION OF THE DRAWINGS

FIG. 1 is a longitudinal sectional view of a terminal and receptacle arrangement embodying the present invention and shown connected together with a wire inserted.

FIG. 2 is a longitudinal sectional view of the terminal.

FIG. 3 is a top plan view of a portion of the terminal.

DESCRIPTION OF THE PREFERRED AND ALTERNATE EMBODIMENTS

Figure 4:
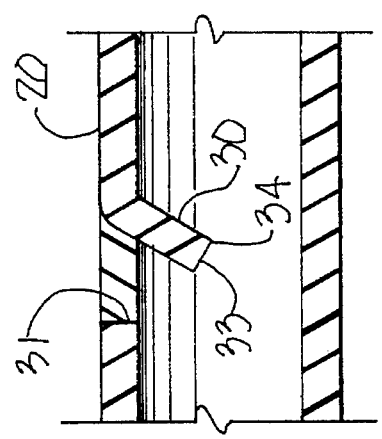
FIG. 4 is an enlarged fragmentary view of a portion of the terminal.

As shown in FIG. 1, the present invention is a connector assembly 1 upon which detachably joins a wire 2 to a receptacle 3 of a probe, such as an electrical contact spring probe 4. The connector assembly 1 utilizes an extended tail 5 at a terminal end 6 of the receptacle 3. In the illustrated example, the wire 2 is a very thin wire, such as of 28 or 30 gauge, which has insulation 8 and a wire core 9. Preferably, the insulation 8 is stripped from the end 0.06 to 0.16 inches.

The tail 5 extends from a necked shoulder 11 of the receptacle 3 to form smaller diameter elongate tube having an open end 12. At an approximately midway location between the shoulder 11 and the open end 12 is a spin crimp ring 14 extending circumferentially around the tail 5 and which extends into the tubular opening of the tail to provide an internal sealing ring as hereinafter described.

To detachably join the wire 2 to the receptacle 3 at its tail 5, the connector assembly 1 includes a terminal 20, FIG. 2. The terminal 20 has a first diameter portion 21 narrowing down to a smaller second diameter portion 22 at a neck 23. Internal of the neck 23 is a shoulder 24 which provides a stop to the insulation portion 8 of the wire 2 when it is inserted, as in FIG. 1. The terminal 20 has an open wire insert end 26 and an opposite closed end 27 preferably formed in a spherical radius for ease of insertion into the tail 5 at its open end 12. Located approximately half way between the neck 23 and the closed end 27 on the terminal second diameter portion 22 is an inwardly extending barb 30 which, in the illustrated example, is struck from the outer surface of the second diameter portion 22 and projects into the hollow interior. The barb 30, FIG. 4, is preferably bent or angled downwardly at a 25°–35° angle from the vertical and projects rearwardly toward the closed end 27. The angle of the barb 30 may vary from approximately 12° to 35° yet still be effective. The barb also preferably extends approximately one-third of the inside diameter of the terminal interior. The barb 30, being struck from the second diameter portion 22, leaves an opening 31 in the outer wall. The barb 30 has an end 33 with a corner or edge 34 which is sharp. The end 33 can be formed, through the use of dies or otherwise, to have various cutting shapes, such as beveled in a radius or beveled in a V shape, to be able to cut into and engage the wire core 9 when inserted into the second diameter portion 22. Additionally, there may be a line or other array of multiple barbs 30 within the terminal 20 for added holding power.

In an example of such terminal 20, the first diameter portion 21 has an outside diameter of 0.027 inches and an inside diameter of 0.021 inches, and the second diameter portion has an outside diameter of 0.0211 inches. The barb 30 projects inwardly approximately 0.005 inches. These dimensions provide an opening left for insertion of the wire core 9 which is approximately 70 to 80% of the diameter of the wire core. The terminal and the receptacle are preferably both made of beryllium copper alloy to be electrically conductive and yet sufficiently hard to withstand manufacturing operations and use. In use, the wire 2 is inserted into the terminal 20 until the insulation 8 abuts against the internal shoulder 24. The wire core 9 extends under the barb 30 and is pinched by it, preventing inadvertent withdrawal of the wire from the terminal 20. With the dimensions provided for receptacles on 0.050 centers, the terminals provide a 1.25 pounds minimum wire retention strength. The connector assembly 1 also provides a vacuum tight seal which is advantageous in vacuum actuated fixtures. As the terminal second diameter portion 22 is inserted into the tail 5, it also encounters the spin crimp ring 14 located between the barb 30 and opening 31 of the terminal 20 and the terminal end 6 of the receptacle 3. The spin crimp ring 14 snugly engages the outer surface of the second diameter portion 22 to provide a vacuum seal. Tests have shown that this construction provides a vacuum seal of less than 0.1 ml/minute leakage at 15 psi applied pressure. Accordingly, the connector assembly 1 is particularly useful in those fixture arrangements in which vacuum must be maintained.

Figure 5:
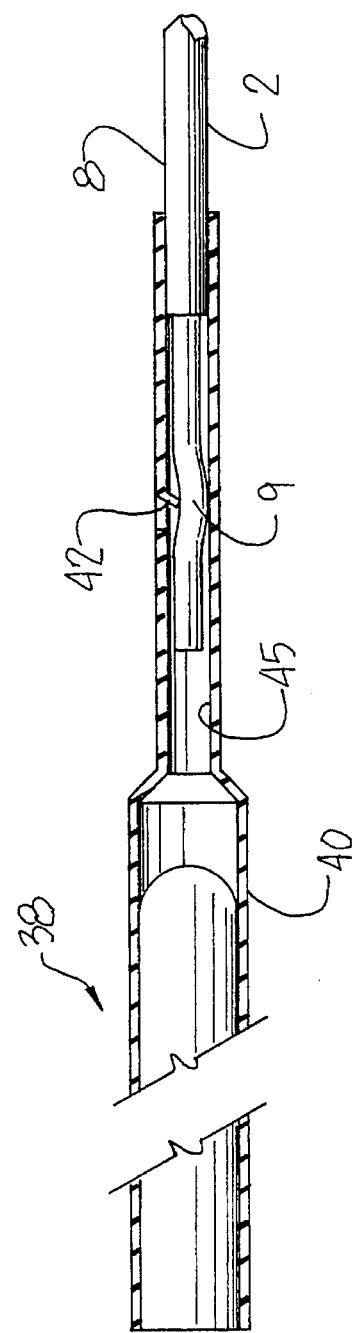
FIG. 5 is a longitudinal sectional view of a receptacle arrangement embodying an alternative embodiment of the invention.

A second embodiment is shown in FIG. 5 and lacks a separate terminal 20 as shown in FIGS. 1–4. The second embodiment 38 consists of a receptacle 40 configured like the receptacle 3 but with a barb 42 the same as the barb 30. The barb 42 extends from the tail 44 and into the tail interior 45. In this embodiment, the wire 3 is inserted directly into the receptacle toll 44 and engaged by the barb 42. The wire 3 is generally inserted until stopped by the insulation 8 abutting the barb 42.

Although this invention has been described in various forms, the invention is not limited thereto except insofar as set forth in the following claims.

What is desired to be claimed and secured by Letters Patent is as follows:

1. A quick-connect electrical connector assembly comprising:
   a) a tubular receptacle for holding an electrical test probe, said receptacle having an open, terminal end;
   b) a tubular terminal sized for insertion within said receptacle terminal end, said terminal having an inner bore and with at least one barb protruding into said inner bore and having a sharp edge so as to engage and trap a connector wire inserted into said terminal with said wire pinched within said inner bore by said barb and inhibited from removal; and
   c) a sealing ring extending between said receptacle and said terminal for substantially maintaining a vacuum seal.

2. A quick-connect electrical connector assembly comprising:
   a) a tubular receptacle for holding an electrical test probe, said receptacle having an open, terminal end;
   b) a tubular terminal sized for insertion into said receptacle terminal end, said terminal having an inner bore and with at least one barb protruding into said inner bore, said barb extending into said inner bore and having a sharp edge so as to engage and trap a connector wire inserted into said terminal with said wire pinched within said inner bore by said barb and inhibited from removal, and
   c) a circumferential ring extending between said receptacle and said terminal for sealing therebetween and substantially maintaining a vacuum seal.

3. The assembly set forth in claim 2 wherein said ring is a crimp ring extending inwardly from said receptacle and positioned adjacent said terminal end so as to engage said terminal.

\* \* \* \* \*